(12) United States Patent
Cheung et al.

(10) Patent No.: US 10,096,568 B2
(45) Date of Patent: Oct. 9, 2018

(54) DIE BONDING TOOL AND SYSTEM

(71) Applicants: Kwok Yuen Cheung, Kwai Chung (HK); Kwok Wah Tong, Kwai Chung (HK); Jin Hui Meng, Kwai Chung (HK); Wan Yin Yau, Kwai Chung (HK); Man Kit Chow, Kwai Chung (HK)

(72) Inventors: Kwok Yuen Cheung, Kwai Chung (HK); Kwok Wah Tong, Kwai Chung (HK); Jin Hui Meng, Kwai Chung (HK); Wan Yin Yau, Kwai Chung (HK); Man Kit Chow, Kwai Chung (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 763 days.

(21) Appl. No.: 14/489,651

(22) Filed: Sep. 18, 2014

(65) Prior Publication Data

US 2016/0086830 A1 Mar. 24, 2016

(51) Int. Cl.
 *B32B 37/00* (2006.01)
 *H01L 23/00* (2006.01)
 *H01L 21/66* (2006.01)

(52) U.S. Cl.
 CPC ............ *H01L 24/75* (2013.01); *H01L 24/743* (2013.01); *H01L 24/83* (2013.01); *H01L 22/12* (2013.01); *H01L 24/29* (2013.01); *H01L 24/32* (2013.01); *H01L 2224/2919* (2013.01); *H01L 2224/29078* (2013.01); *H01L 2224/32225* (2013.01); *H01L 2224/32245* (2013.01); *H01L 2224/7531* (2013.01); *H01L 2224/75251* (2013.01); *H01L 2224/75301* (2013.01); *H01L 2224/75611* (2013.01); *H01L 2224/75702* (2013.01); *H01L 2224/75745* (2013.01); *H01L 2224/831* (2013.01); *H01L 2224/83191* (2013.01); *H01L 2224/83193* (2013.01); *H01L 2224/83862* (2013.01)

(58) Field of Classification Search
 CPC ........ H01L 24/75; H01L 24/743; H01L 24/83
 USPC ...................... 156/580, 581, 583.1
 See application file for complete search history.

(56) References Cited

U.S. PATENT DOCUMENTS

| 5,971,250 A | 10/1999 | Safabakhsh et al. |
| 2009/0020229 A1* | 1/2009 | Yoon ............... H01L 21/6838 156/350 |
| 2014/0174652 A1* | 6/2014 | Groeninger ......... B25J 15/0616 156/280 |

* cited by examiner

Primary Examiner — James Sells
(74) Attorney, Agent, or Firm — Ostrolenk Faber LLP (57) ABSTRACT

Disclosed is a die bonding tool comprising: a rigid body; and a collet having a die-holding portion; wherein the collet is mechanically coupled to the rigid body by a flexible element which is configured to angularly deflect relative to the rigid body on application of a torque to the collet and/or to a die held by the collet. Also disclosed is a die bonding system comprising the die bonding tool, and an adhesive dispenser for a die bonding system.

17 Claims, 9 Drawing Sheets

DIE BONDING TOOL AND SYSTEM

TECHNICAL FIELD

The present invention relates to the field of semiconductor assembly and packaging, and more particularly (but not exclusively), to a tool and a system for attaching semiconductor dies onto substrates using adhesive.

BACKGROUND

The semiconductor die attachment process is one of the steps involved in semiconductor device manufacturing. It involves attaching a semiconductor die to a specific bond pad on a substrate. The substrate can be in the form of a lead frame, a printed circuit board (PCB) or other suitable mechanical structure. The attachment is usually achieved by first dispensing an adhesive material onto the substrate, and then pressing the die into the adhesive material under a certain pressure and for a certain time.

After the die is attached, a thermal treatment such as oven curing is performed in order to solidify the adhesive and firmly secure the die on the substrate. The secured die is then electrically coupled to the substrate by connecting bonding wires between the die and the conductive leads on the substrate. The die and the bonding wires are finally encapsulated in a protective case using a molding material, such as a thermoplastic resin or ceramic, to complete the packaging of the semiconductor device.

The thickness of adhesive between the bottom surface of the die and the substrate upper surface is referred as the bond line thickness (BLT). In general, the average BLT of the bonded die is a key factor affecting the reliability of the final product of the semiconductor device. If the BLT is too thin, the die may not be completely secured on the substrate. On the other hand, if the BLT is too thick, excess adhesive may overflow to contaminate the die surface. Accordingly, much attention in the art has been focused on controlling the average bond line thickness for the die attachment process.

In addition to controlling the average BLT, it is important to carefully control the die tilt (the maximum difference between the BLT at the four corners of the die), which can also have an impact on the semiconductor device's reliability. For instance, the die tilt may make the stress distribution across the device uneven, with the region with the thinnest bond line experiencing the highest stress. Further, for some devices the die tilt can have a significant effect on product quality for other reasons. For example, for an optical device such as a miniature camera, any tilt of the image sensor die will result in misalignment between the sensor element axis and the optical element axis. This reduces the image quality produced by the optical device.

Conventionally, die tilt is minimised by adjusting the bonding tool tilt to the same level as the die attach platform tilt prior to bonding. However, thermal effects caused by machine operation may change the bond tool tilt level. This can result in a die tilt variation throughout the bonding operation. Substrate surface level variation, which may occur due to variations in the substrate manufacturing process, is another factor that can affect die tilt.

Conventional tilt adjustment processes carried out during bonding can only guarantee that die tilt and BLT are optimal immediately after the die has been attached. The adhesive used to bind the substrate and the die has not been cured at that moment. The bonded substrate is subject to movement while being transferred to subsequent processing steps. The adhesive between the substrate and the die is consequently still subject to change, such that the die tilt and BLT of the bonded sample are not stabilised.

To stabilise the die orientation and BLT, thermal curing of the adhesive must be performed. Previously it has been proposed to perform an instant adhesive cure process during die bonding, by providing a bond tool with an embedded heater (see U.S. Pat. No. 5,971,250). As the bond tool presses the die onto the substrate, the heater in the bond tool can heat up the adhesive to cure it. A disadvantage of this proposal is that embedding a heater in a bond tool complicates the bond tool design. In addition, the direct heating of the bond tool may change the tilt level setup due to thermal effects.

There remains a need for a die attachment tool and system which overcomes or alleviates at least one of the foregoing difficulties, or which at least provides a useful alternative.

SUMMARY

Certain embodiments of the invention relate to a die bonding tool comprising:
a rigid body; and
a collet having a die-holding portion;
wherein the collet is mechanically coupled to the rigid body by a flexible element which is configured to angularly deflect relative to the rigid body on application of a torque to the collet and/or to a semiconductor die held by the collet.

Other embodiments relate to a die bonding system for attaching a semiconductor die to a substrate, the die bonding system comprising:
a die bonding tool as described in the previous paragraph; and
a die attach platform configured to support the substrate.

Accordingly, if a substrate to which the semiconductor die is to be bonded is angularly misaligned with the bonding surface of the die, when the die is pressed against the substrate by the bonding tool it will tend to result in application of a torque to the die, thus deflecting the collet and automatically adjusting the orientation of the bonding surface, until it is level with the substrate. This ensures that die tilt is minimised, without the need for additional cameras and image processing functionality for monitoring and correcting misalignment between the die and substrate.

In certain embodiments, the flexible element comprises a shaft having a first section, a section, and at least one peripheral cut-out portion intermediate the first and second sections, such that the first and second sections are flexible relative to each other. For example, the cut-out portion may be a single helical cut-out portion which extends at least once around the perimeter of the shaft. Alternatively, the shaft may have a plurality of circular peripheral cut-out portions intermediate the first and second sections.

The collet may comprise a stand-off feature extending away from a surface of the collet and spaced from the die-holding portion. In certain embodiments, the stand-off feature comprises a stand-off element at each corner. The stand-off feature may extend from the surface at a predetermined distance which depends on a desired bond line thickness. In some embodiments, each stand-off element is removably attached to the surface of the collet.

In some situations the substrate may have some surface unevenness. Advantageously, therefore, the use of a stand-off element may ensure that any such surface unevenness does not contribute to die tilt since the deflection of the flexible element in this case is driven by the stand-off element and not the die itself.

Embodiments of the invention can achieve an accuracy of 50 microns. This allows the bonding tool or die bonding system to address substrate surface unevenness up to about 25 and 30 microns.

In some embodiments, the die bonding system comprises an adhesive dispenser, the adhesive dispenser having a dispensing end which is oriented to apply adhesive to an underside of a semiconductor die secured at the die-holding portion. The die attach platform may comprise at least one heating element.

By providing means to apply adhesive directly to the bonding surface of the die, it is possible to cure the adhesive as soon as the die is in place on the substrate. Further, by providing the heating element(s) in the die attach platform, rather than in the bonding tool, it is possible to provide a simpler bonding tool, and to avoid changes in the tilt level setup which may occur due to thermal effects.

In other embodiments, the die bonding system further comprises an up-look camera configured to inspect an underside of a semiconductor die secured at the die-holding portion.

Other embodiments relate to an adhesive dispenser for a die bonding system, the adhesive dispenser comprising a dispensing assembly comprising a tube, the tube being in fluid communication with at least one nozzle, and having a first section configured to couple to an outlet of an adhesive cartridge, and a second section extending from the first section; wherein the second section terminates at or is fluidly coupled to the at least one nozzle; and wherein the second section is oriented at a different angle to the first section, such that the at least one nozzle is configured to dispense adhesive in a generally upward direction when the first section is disposed in a generally downward direction.

The second section may terminate at a single nozzle.

In certain embodiments, the adhesive dispenser comprises a bracket for mounting the dispensing assembly to a translation stage.

The second section may be coupled to a dispensing head, the dispensing head comprising an array of nozzles configured to apply adhesive in a desired pattern.

BRIEF DESCRIPTION OF THE DRAWINGS

Embodiments of the invention will now be described, by way of non-limiting example only, with reference to the accompanying drawings in which.

DETAILED DESCRIPTION

Figure 1:
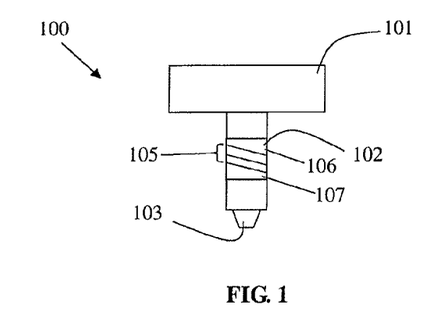
FIG. 1 is a schematic side plan view of a die bonding tool according to an embodiment of the invention.

Referring initially to FIG. 1, there is shown a schematic view of a die bonding tool 100. The die bonding tool 100 comprises a rigid body 101 and a collet 103 which is mechanically coupled to the rigid body 101 by a flexible element 102. The rigid body 101 is configured to mount the die bonding tool 100 to a moving stage (e.g., an xyz-translation stage) in known fashion, such that the bonding tool 100 can be moved to pick and place semiconductor dies at desired locations on a substrate.

Figure 2:
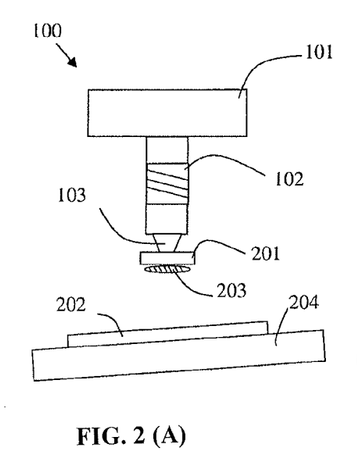
FIG. 2(A) and FIG. 2(B) show the die bonding tool of FIG. 1 in use.

The collet 103 is at the tip of the bonding tool 100 and has an aperture (not shown) through which a vacuum can be applied to secure a semiconductor die 201 (FIG. 2) at the collet 103. During a die bonding process, the bonding tool 100 moves to a target position of a substrate to bond the die 201, and the vacuum is then released.

The flexible element 102 allows the collet 103 to deflect angularly relative to the rigid body 101 when a torque is applied to a die 201 attached at the collet 103, to automatically correct for angular misalignment between the bonding (lower) surface of the die and the substrate to which it is being bonded. The flexible element 102 may be a flexible coupling such as a bellows coupling or beam coupling, for example. Other types of flexible element are also possible, for example flexible rods and the like.

In one example, the flexible element 102 comprises a shaft having a first section 106 and a second section 107. The shaft has a peripheral cut-out portion 105 intermediate the first and second sections 106 and 107. In the example shown in FIG. 1, the cut-out portion 105 is a helical cut-out portion comprising three turns. The cut-out portion 105 defines gaps in the perimeter of the shaft 104 which allow flexure of the shaft 104 when a torque is applied to a die attached at collet 103 as shown in FIG. 2(B). Alternative forms of cut-out portion are also possible; for example, a series of circular cut-outs formed around a perimeter of the shaft 104 may be used to define gaps 105 and thus provide the flexure property of the shaft 104. The use of three turns as shown in FIG. 1 is exemplary, and it will be appreciated that fewer or more turns in a helical cut-out portion, or fewer or more than three circular cut-out portions (for example) is also possible provided the desired degree of flexure of the shaft 104 is obtained. The degree of flexure may be modulated according to the number and/or width of the cut-out portion(s), for example.

Figure 12:
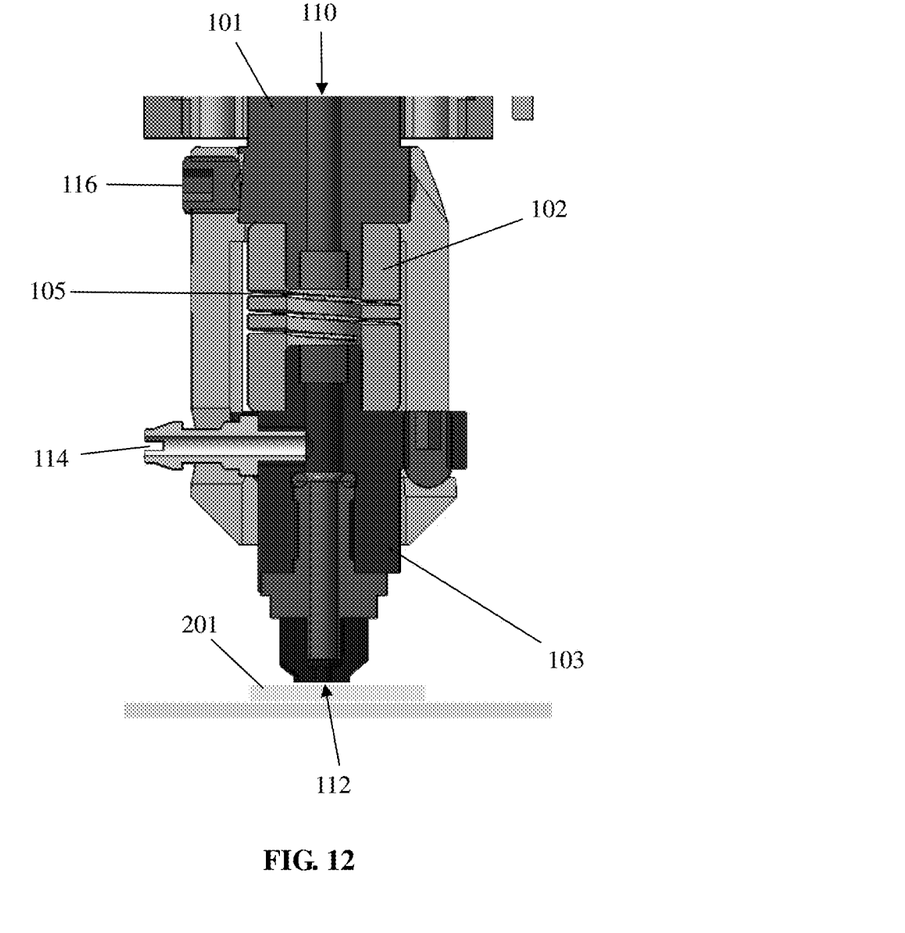
FIG. 12 is a side view illustration of an example of the die bonding tool for attachment of the die at the collet, illustrating a cut-out portion interrupting the channel between the inlet aperture and attachment aperture of the collet, as well as a first bypass inlet provided in the collet, according to an embodiment of the invention.

In some embodiments the cut-out portion(s) 105 may be such as to interrupt the vacuum used for attachment of the die 201 at the collet 103. For example, as shown in FIG. 12, a channel extending between vacuum inlet aperture 110 of rigid body 101 and attachment aperture 112 of collet 103 is interrupted by cut-out portion 105. This would result in air being drawn into the channel when a vacuum is applied. To overcome this problem, a first bypass inlet 114 is provided in the collet 103 and a second bypass inlet is provided in the rigid body 101. A vacuum tube (not shown) can then be connected between the first and second bypass inlets 114, 116 in order to bypass the flexible element 102 and thus prevent or minimise vacuum leakage.

The flexible element 102 can be coupled to the rigid body 101 and the collet 103 in any suitable fashion, for example by way of fasteners such as screws. A first fastener (or set of fasteners) may connect the first section 106 of the shaft of flexible element 102 to rigid body 101 and a second fastener (or set of fasteners) may connect the second section 107 to collet 103.

Turning now to FIG. 2(A) and FIG. 2(B), the die bonding tool 100 is shown in use as part of a die bonding system which also comprises a substrate-receiving platform 204.

In FIG. 2(A) a semiconductor die 201 has been attached via vacuum to the collet 103 and adhesive 203 has been applied to a bonding surface of the die 201. A substrate 202 is supported by die attach platform 204 and has a different tilt level than the rigid body 101 and the bonding surface of the die. Before the die 201 is bonded on the substrate 202, an adhesive 203 is dispensed at the bottom of the die 201. The bonding tool 100 then moves downward and presses the die 201 onto the substrate 202. In order to achieve a desired bond line thickness and adhesive bleed-out, a bond force is applied (FIG. 2(B)) via the rigid body 101. Due to the tilt level difference between the rigid body 101 and the die attach platform 204, and the fact that rigid body 101 and die attach platform 204 are rigid structures, one part of the die 201 will contact the substrate 202 before the rest of the die. As force continues to be applied by the bonding tool 100, a torque will consequently be applied to the die 201. This causes flexible element 102 to bend through an angle corresponding to the angular misalignment between the bonding surface of die 201 and the surface of substrate 202, until the whole bonding surface contacts the substrate. Advantageously, therefore, die tilt is substantially reduced or eliminated.

Figure 3:
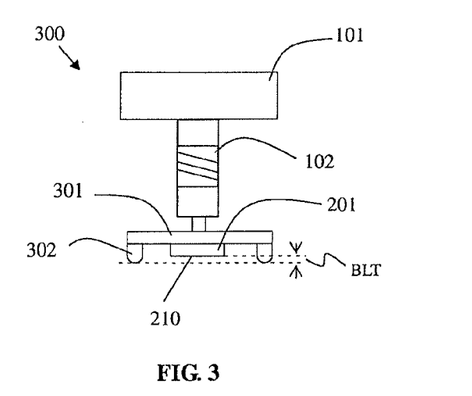
FIG. 3 is a schematic side plan view of an alternative die bonding tool.

FIG. 3 shows an alternative embodiment of a bonding tool 300. The bonding tool 300 comprises a rigid body 101 and flexible element 102 which are substantially identical to those of FIGS. 1 and 2, but has an alternative form of collet 301 which comprises a stand-off feature 302 extending from its surface.

Figure 8:
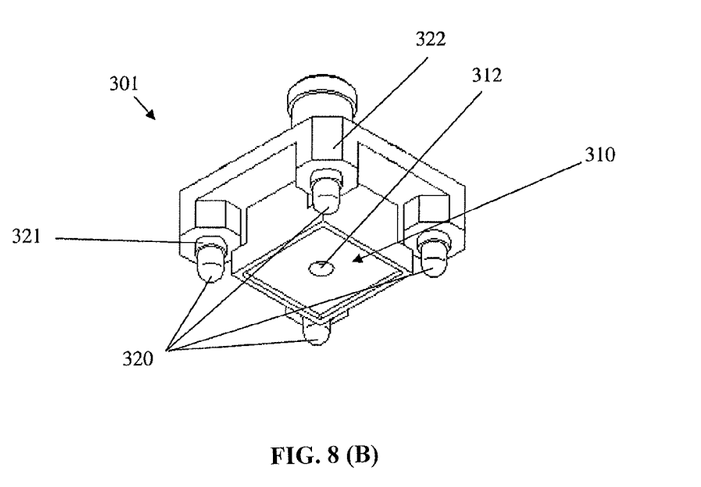
FIGS. 8(A) and 8(B) show top and bottom perspective views of a collet according to an embodiment of the invention.

At the centre of the collet 301 there is a die-holding portion 310 having a vacuum hole 312 through which a vacuum can be applied to pick up and secure the die 201. The stand-off feature 302 surrounds the die-holding portion 310 at the collet 301. In one embodiment, the stand-off feature 302 comprises a plurality of stand-off elements 320, one at each corner of the collet 301, as best shown in FIGS. 8(A) and 8(B). In other embodiments the stand-off feature may comprise a single square or circular stand-off element surrounding the die-holding portion 310, for example. The stand-off elements 320 may alternatively be placed along the edges, rather than the corners, of the collet 301.

The stand-off feature 302 assists in reducing or eliminating die tilt when there is substrate surface level variation. The height of the stand-off feature 302 may depend on the thickness of the die 201 and the desired bond line thickness. In particular, for a given desired bond line thickness, the stand-off feature 302 will extend further than the bonding surface 210 of the die 201 by the desired bond line thickness as shown in FIG. 3.

Figure 4:
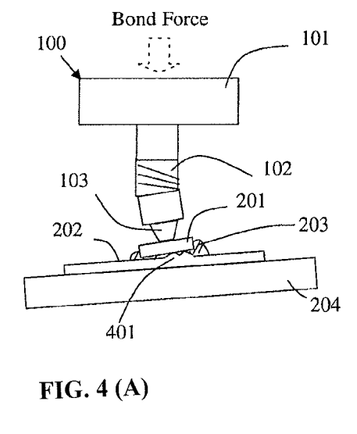
FIG. 4(A) and FIG. 4(B) show the die bonding tool of FIG. 3 in use.

Turning now to FIGS. 4(A) and 4(B), the major advantage of the stand-off feature 302 is illustrated. In FIG. 4(A), the bonding tool 100 of FIG. 1, having collet 103, encounters a surface variation 401 of the substrate 202. The localised level variation 401 of the substrate 202 may be sufficient in some circumstances to overwhelm the automatic tilt correction provided by flexible element 102.

In the die bonding system shown in FIG. 4(B), instead of the die 201 being directly pressed onto the substrate 202 by the bonding tool 300, the first contact with the substrate 202 is made by the stand-off feature 302. If there is an angular misalignment between the bonding surface 210 and the plane of the substrate 202, one or more of the stand-off elements 320 of stand-off feature 302 will contact the substrate before the others, thereby resulting in application of torque to the collet 301 such that flexible element 102 is caused to angularly deflect, in similar fashion to the mechanism described above, until all four stand-off elements 320 are in contact with the substrate 202. Because the bonding surface 210 of the die 201 is held above the substrate 202 by the stand-off elements 320 throughout, any localised surface variations will not contribute to die tilt, and the die 201 can be precisely pressed down to provide the desired BLT.

In some embodiments the stand-off elements 320 are removably attached to the collet 301 such that they can be removed and replaced with stand-off elements 320 of a different length, thereby allowing varying BLTs to be achieved. For example, the stand-off elements 320 may have threaded ends received in respective threaded bores 322, with a stop 321 on each stand-off element 320 to maintain the desired stand-off distance. In other embodiments, the stand-off elements 320 may be length-adjustable to adjust the stand-off distance, such as by providing a threaded collar on a shaft of the stand-off element, for example.

Figure 5:
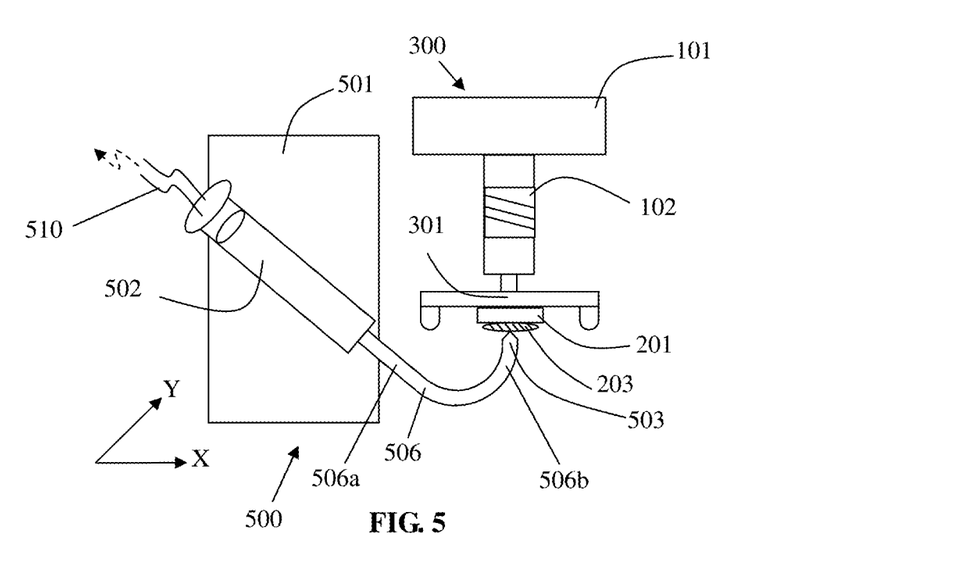
FIG. 5 is a schematic illustration of adhesive being applied to a semiconductor die in a die bonding process according to an embodiment of the invention.

Turning to FIG. 5, a further feature of the die bonding system of FIG. 4(B) is shown. In addition to the die bonding tool 300 and the die attach platform 204 (omitted for clarity), the system may comprise an adhesive dispenser 500. The dispenser 500 comprises a mounting bracket 501, and a dispensing assembly comprising a syringe of adhesive 502, an adhesive delivery tube 506 coupled to the syringe 502, and an inverted dispensing nozzle 503, which is illustrated in highly schematic form, and through which adhesive can be dispensed via delivery tube 506. The mounting bracket 501 may be used to mount the dispensing assembly to a solid support or to a movable support such as a translation stage.

The adhesive dispenser 500 comprises a gas delivery tube 510, through which it can receive pressurised gas under control of a dispensing controller (not shown) which regulates the timing and pressure of the adhesive dispensing operation. The adhesive syringe 502 is mounted to mounting bracket 501 by a suitable mounting mechanism, for example a collar or bracket.

By using an inverted (i.e., upward-facing) dispensing nozzle 503 it is possible to apply adhesive directly to the bonding surface of a die 201 held by the bonding tool 300, rather than to the substrate to which the die 201 is to be bonded. This is advantageous in terms of allowing curing to take place immediately on applying the die to the substrate, as will later be described. In addition, by applying adhesive to the die rather than the substrate, the possibility of accumulation of particulate matter on the adhesive prior to bonding is reduced.

As shown in FIG. 5, the dispensing assembly of adhesive dispenser 500 has a tube 506 of unitary construction. The tube 506 has a first section 506a which, when a cartridge 502 is retained at the mounting bracket 501, is substantially aligned with a main axis of the cartridge 502, and is disposed in a generally downward direction when the dispensing assembly is attached, via mounting bracket 501, to a support. The first section 506a may make an angle of between 0° and about 45° with the vertical, for example. Extending from the first section 506a is a second section 506b, which has a terminal portion oriented at a different angle to the first section 506a. In the illustrated embodiment, the second section 506b extends from the first portion 506a via an intermediate curved portion, and terminates in a single nozzle 503 which is oriented generally upwardly when the mounting bracket 501 is mounted to a support.

Advantageously, the mounting bracket 501 of dispenser 500 may be mounted to a moving table such as an XY- or XYZ-translation stage (not shown). In that case, instead of the bonding tool 300 being moved towards the nozzle 503, the bonding tool 300 may be held stationary and the nozzle 503 moved towards a die 201 held at the die-holding portion 310 of collet 301. The position of the nozzle 503 can be adjusted relative to the die 201 by the translation stage to apply adhesive at varying locations on the die. This means that, for example, only a single nozzle 503 need be used in order to scan across the die surface to apply different patterns of adhesive dots. There is thus no need to switch nozzles to provide different adhesive dispensing patterns.

Figure 9:
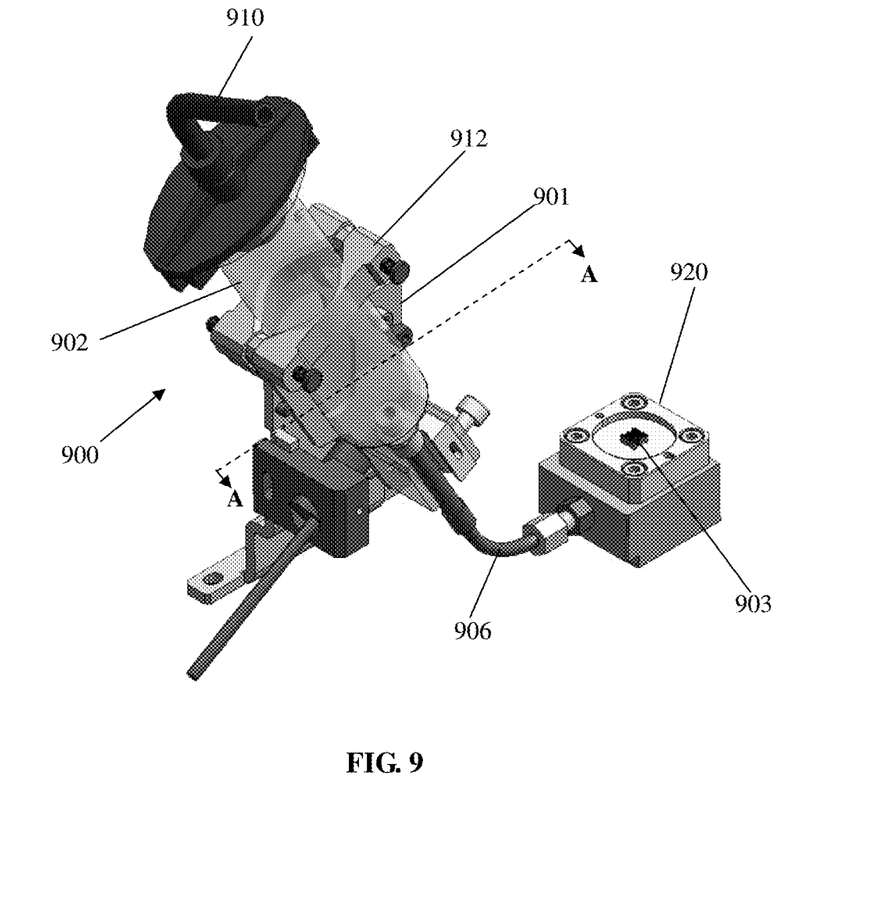
FIG. 9 is a perspective view of an adhesive dispenser according to embodiments.
Figure 10:
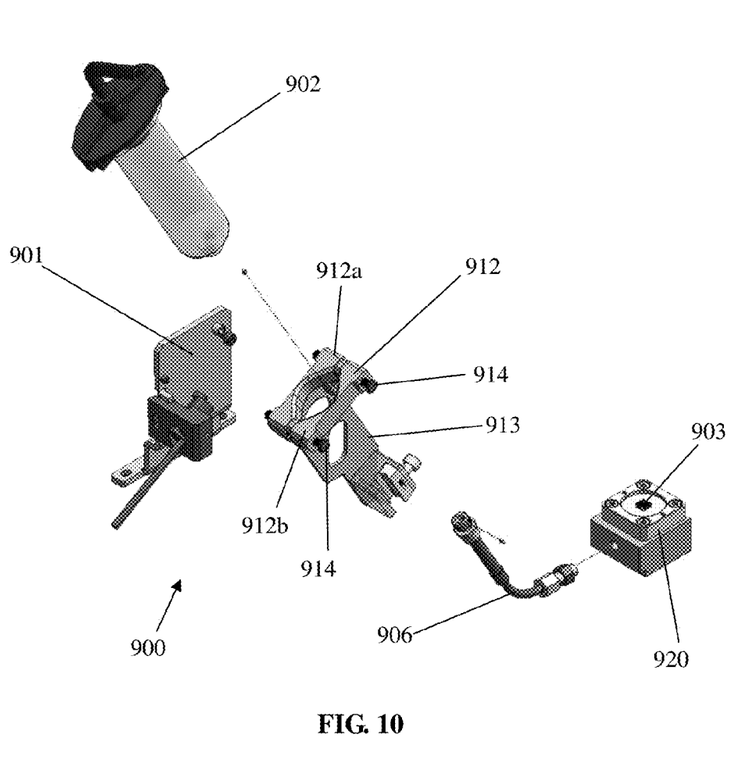
FIG. 10 is an exploded view of the adhesive dispenser of FIG. 9.
Figure 11:
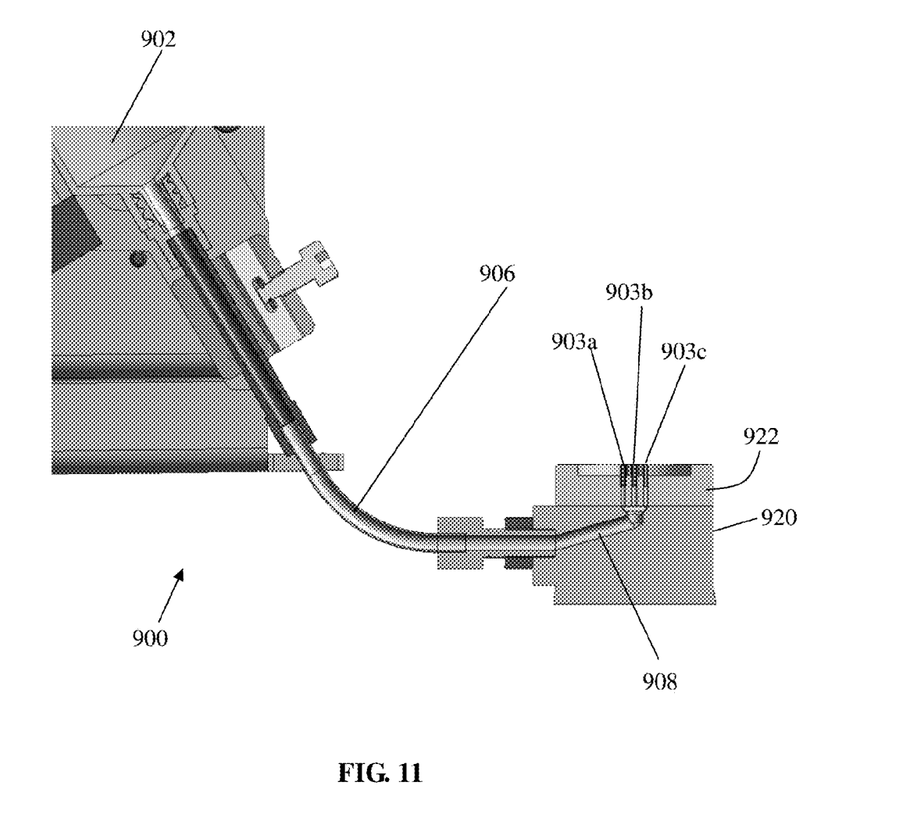
FIG. 11 is a cross-section through the line A-A of FIG. 9.

In an alternative embodiment, shown in FIGS. 9-11, an adhesive dispenser 900 comprises a gas delivery tube 910, through which it can receive pressurised gas under control of a dispensing controller (not shown) which regulates the timing and pressure of the adhesive dispensing operation. An adhesive syringe 902 is mounted to mounting bracket 901 by a two-piece collar 912 having a first part 912a and a second part 912b which cooperate to form an aperture to receive the syringe 902. The first part 912a is attached to a mounting plate 913 which is configured for attachment to the mounting bracket 901. The second part 912b is attachable to the first part 912a by means of threaded fasteners 914. When the adhesive syringe 902 is positioned in the aperture between the first and second parts 912a and 912b, the threaded fasteners 914 can be tightened to clamp the syringe 902 in place.

Adhesive dispenser 900 also comprises an adhesive delivery tube 906 which curves downwardly from the syringe 902 to a nozzle block 920 which carries a dispensing nozzle array 903. In particular, with reference to FIG. 11, the adhesive delivery tube 906 comprises a first section 906a which, when a cartridge 902 is retained within collar 912, is substantially aligned with a main axis of the cartridge 902, and is disposed in a generally downward direction when the dispensing assembly is attached, via mounting bracket 901, to a support. The first section 906a may make an angle of between 0° and about 45° with the vertical, for example. Extending from the first section 906a is a second section 906b, which has a terminal portion oriented at a different angle to the first section 906a. In the illustrated embodiment, the second section 906b extends from the first portion 906a via an intermediate curved portion, and
has a terminal portion which is substantially horizontal when the mounting bracket 501 is mounted to a support. Differently to the embodiment of FIG. 5, the terminal portion of the second section 906b is coupled, via a coupling element 907, to a nozzle block 920 which carries a generally upwardly facing nozzle array 903. The nozzle array 903 is configured to dispense adhesive in a desired pattern. In the illustrated example, the array 903 is a square 3×3 array of nozzles.

Nozzle block 920 has an internal channel 908 which is in communication with the terminal portion of the adhesive delivery tube 906 and which inclines slightly upwardly from the adhesive delivery tube 906 to the inlets of nozzles 903a, 903b, 903c of array 903. The terminal portion is received in the coupling element 907 which assists in providing a substantially liquid-tight path between the tube 906 and the internal channel 908 of the nozzle block. In some embodiments, the upper portion 922 of the nozzle block 920, which carries the nozzle array 903, may be user-replaceable with an alternative upper portion having a different nozzle pattern.

In an adhesive dispensing operation using the dispenser 900, a die 201 may be picked up by the bonding tool 300, which moves the die 201 to the nozzle block 920 of dispenser 900. The collet 301 is then moved downwardly towards nozzle array 903 such that the bonding surface of die 201 can be positioned over the nozzle array 903, and adhesive is then dispensed from the nozzles of array 903 onto the bonding surface in the desired pattern.

It will be appreciated that elements of the dispenser 500 may be used in the dispenser 900 and vice versa. For example, the dispenser 900 may be modified by mounting to a translation stage, and the nozzle array 903 of nozzle block 920 replaced with a single upwardly-facing nozzle.

Figure 6:
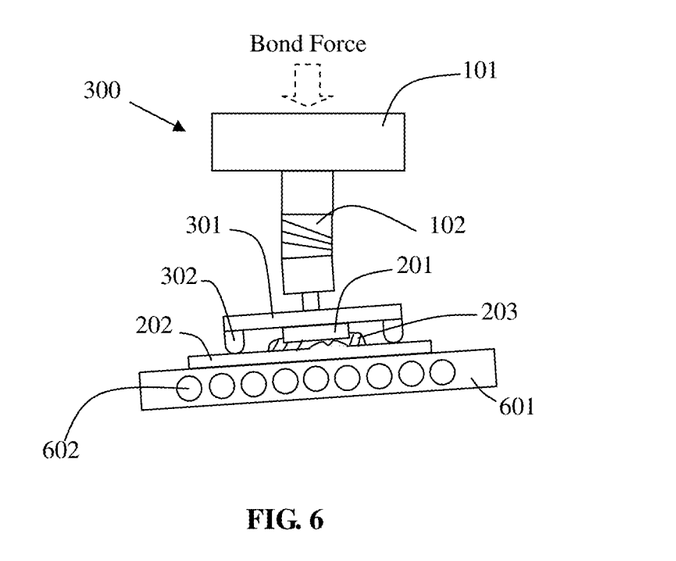
FIG. 6 shows an embodiment of a die bonding system having a substrate-receiving platform with in-built heaters.

FIG. 6 shows an alternative to the die bonding system of FIGS. 2, 4(B) and 5. Instead of the die attach platform 204 described earlier, the system shown in FIG. 6 has a die attach platform 601 which has embedded heating elements 602. The heating elements 602 may be maintained at a temperature which is high enough to cure adhesive 203. Accordingly, when the bonding tool 300 presses the die 201 towards the substrate 202, the adhesive cure takes place simultaneously. Advantageously, therefore, as soon as the correct orientation of the die 201 and the desired BLT is achieved by collet 301 and flexible element 102 acting in concert, the adhesive is cured to fix the position of the die such that it will not be altered by subsequent processing.

Figure 7:
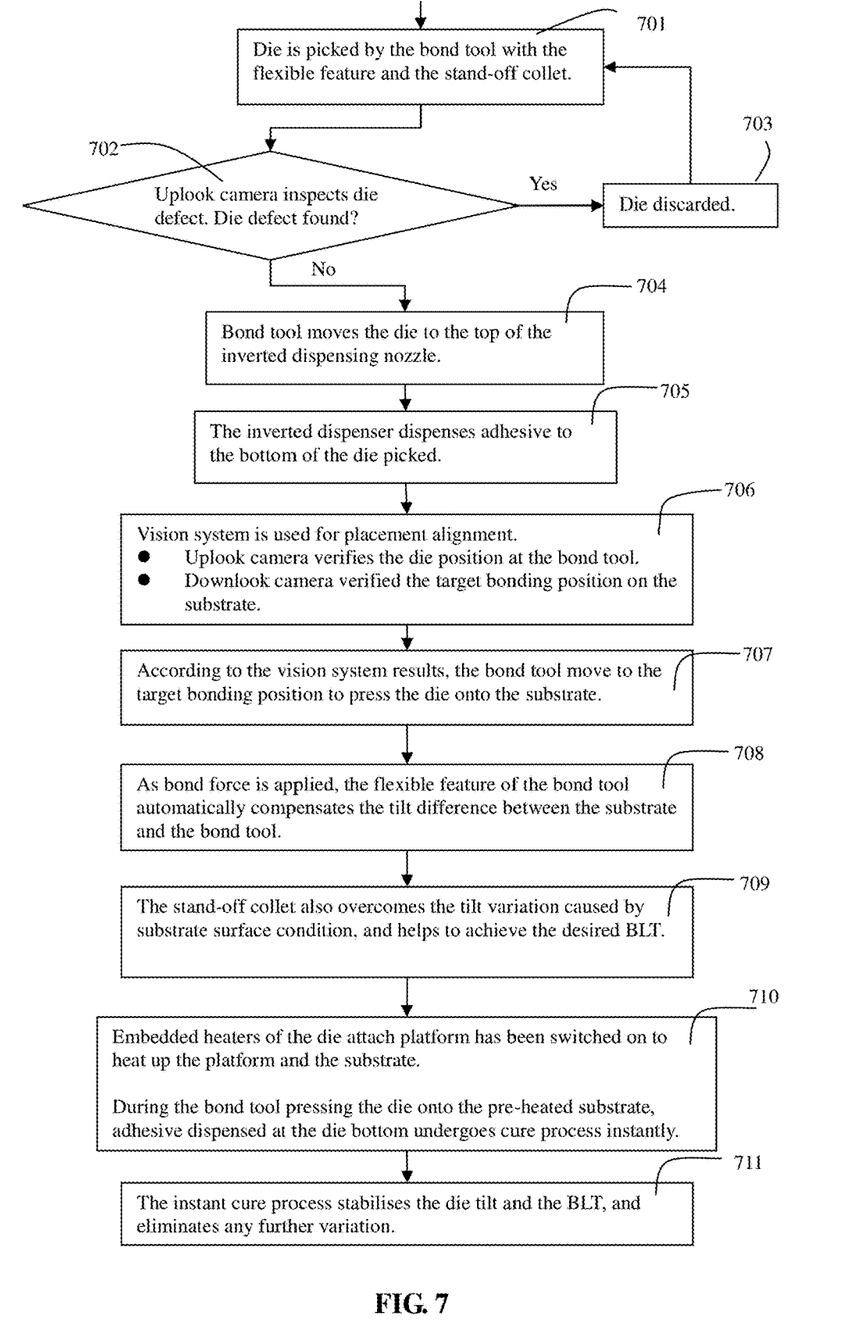
FIG. 7 is a flow diagram of a die bonding process according to an embodiment of the invention.

An exemplary processing workflow using embodiments of the die bonding system is shown in FIG. 7. At step 701, a die 201 is picked up by the collet 301 of bonding tool 300. A vision system (not shown in the Figures) comprising an up-look camera inspects the bonding surface of die 201 at step 702. If a die defect is located then the die 201 is discarded at step 703. Otherwise, the bonding tool 300 moves the die 201 to the top of the nozzle array 503 of adhesive dispenser 500 (step 704) and adhesive is then dispensed to the bonding surface (step 705) in the desired pattern as previously described.

Following dispensing of the adhesive, the vision system determines the relative positions of the die 201 and target position on the substrate 202 (step 706) in order to properly align the two. In particular, the up-look camera is used to determine the position of the die 201 and a down-look camera is used to locate the target position. Based on the position determination, the position of bonding tool 300 is adjusted to bring the die 201 into contact with the substrate 202 at the target position, and to apply a bonding force as described earlier (step 707).

As the bonding force is applied, any misalignment between the bonding surface of die 201 and the substrate 202 is automatically corrected by the mechanism described earlier in relation to the bonding tool 100 or the bonding tool 300 (step 708). In particular, the flexible element 102 deflects angularly to compensate for the misalignment. If the bonding tool 300 is used, the stand-off collet 301 will prevent die tilt due to any surface variation on the substrate (step 709). Once the die 201 has been pressed onto the substrate 202, the heating elements 602 embedded in the die attach platform 601 will cure the adhesive (step 710), thereby fixing the die 201 to stabilise its alignment and the bond line thickness (step 711).

Although particular embodiments of the invention have been described in detail, many modifications and variations are possible within the scope of the invention, as will be clear to a skilled reader. For example, while the adhesive dispenser 500 and heated die attach platform 601 have been described in conjunction with the bonding tool 300 with stand-off collet 301, it will be appreciated that they can also be used with bonding tool 100. Further, some embodiments may use a conventional adhesive dispenser which applies adhesive to the substrate target position rather than directly to the die.

The invention claimed is:

1. A die bonding tool comprising:
    a rigid body; and
    a collet having a die-holding portion;
    wherein the collet is mechanically coupled to the rigid body by a flexible element which is configured to angularly bend relative to the rigid body on application of a torque to the collet and/or to a die held by the collet.

2. A die bonding tool according to claim 1, wherein the flexible element comprises a shaft having a first section, a second section, and at least one peripheral cut-out portion defining gaps in the flexible element intermediate the first and second sections, such that the first and second sections are flexible relative to each other.

3. A die bonding tool according to claim 2, wherein the cut-out portion is a helical cut-out portion which extends at least once around the perimeter of the shaft.

4. A die bonding tool according to claim 1, wherein the collet comprises a stand-off feature extending away from a surface of the collet and spaced from the die-holding portion.

5. A die bonding tool according to claim 4, wherein the stand-off feature comprises a stand-off element at each corner of the collet.

6. A die bonding tool according to claim 4, wherein the stand-off feature extends from the surface at a predetermined distance which depends on a desired bond line thickness.

7. A die bonding tool according to claim 5, wherein each stand-off element is removably attached to the surface of the collet.

8. A die bonding system for attaching a semiconductor die to a substrate, the die bonding system comprising:
    a die bonding tool according to claim 1; and
    a die attach platform configured to support the substrate.

9. A die bonding system according to claim 8, wherein the flexible element comprises a shaft having a first section, a section section, and at least one peripheral cut-out portion intermediate the first and second sections, such that the first and second sections are flexible relative to each other.

10. A die bonding system according to claim 9, wherein the cut-out portion is a helical cut-out portion which extends at least once around the perimeter of the shaft.

11. A die bonding system according to claim 8, wherein the collet comprises a stand-off feature extending from a surface of the collet and spaced from the die-holding portion.

12. A die bonding system according to claim 11, wherein the stand-off feature comprises a stand-off element at each corner.

13. A die bonding system according to claim 11, wherein the stand-off feature extends from the surface at a predetermined distance which depends on a desired bond line thickness.

14. A die bonding system according to claim 11, wherein each stand-off element is removably attached to the surface of the collet.

15. A die bonding system according to claim 8, further comprising an adhesive dispenser, the adhesive dispenser having a dispensing end which is oriented to apply adhesive to an underside of a semiconductor die secured at the die-holding portion.

16. A die bonding system according to claim 8, wherein the die attach platform comprises at least one heating element.

17. A die bonding system according to claim 8, further comprising an up-look camera configured to inspect an underside of a semiconductor die secured at the die-holding portion.

* * * * *